(12) United States Patent
Ryan et al.

(10) Patent No.: US 9,059,255 B2
(45) Date of Patent: Jun. 16, 2015

(54) METHODS OF FORMING NON-CONTINUOUS CONDUCTIVE LAYERS FOR CONDUCTIVE STRUCTURES ON AN INTEGRATED CIRCUIT PRODUCT

(71) Applicant: GLOBALFOUNDRIES Inc., Grand Cayman (KY)

(72) Inventors: Vivian W. Ryan, Berne, NY (US); Xunyuan Zhang, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/781,921

(22) Filed: Mar. 1, 2013

(65) Prior Publication Data
US 2014/0246775 A1 Sep. 4, 2014

(51) Int. Cl.
*H01L 21/768* (2006.01)
*H01L 23/532* (2006.01)

(52) U.S. Cl.
CPC ... *H01L 21/76843* (2013.01); *H01L 2924/0002* (2013.01); *H01L 23/53238* (2013.01)

(58) Field of Classification Search
CPC .................. H01L 23/53238; H01L 2924/00; H01L 2924/0002; H01L 21/76843; H01L 21/76816; H01L 21/823871; H01L 29/7834
USPC ......... 257/690, 720, 750, 751, 758, 773, 774, 257/E21.584, E23.01, E23; 438/612, 628, 438/640, 687
See application file for complete search history.

(56) References Cited

U.S. PATENT DOCUMENTS

| | | | | |
|---|---|---|---|---|
| 6,057,236 | A * | 5/2000 | Clevenger et al. | 438/680 |
| 6,069,068 | A * | 5/2000 | Rathore et al. | 438/628 |
| 6,878,616 | B1 * | 4/2005 | Casey et al. | 438/623 |
| 2003/0190819 | A1 * | 10/2003 | Chang et al. | 438/760 |
| 2005/0070097 | A1 * | 3/2005 | Barmak et al. | 438/653 |
| 2006/0254504 | A1 * | 11/2006 | Dai et al. | 117/84 |
| 2006/0269658 | A1 * | 11/2006 | Hafezi et al. | 427/98.4 |
| 2008/0260940 | A1 * | 10/2008 | Yoon et al. | 427/96.2 |

* cited by examiner

*Primary Examiner* — Marcos D. Pizarro
*Assistant Examiner* — Sue Tang
(74) *Attorney, Agent, or Firm* — Amerson Law Firm, PLLC

(57) ABSTRACT

One illustrative method disclosed herein includes forming a trench/via in a layer of insulating material, forming a non-continuous layer comprised of a plurality of spaced-apart conductive structures on the layer of insulating material in the trench/via, wherein portions of the layer of insulating material not covered by the plurality of spaced-apart conductive structures remain exposed, forming at least one barrier layer on the non-continuous layer, wherein the barrier layer contacts the spaced-apart conductive structures and the exposed portions of the layer of insulating material, forming at least one liner layer above the barrier layer, and forming a conductive structure in the trench/via above the liner layer.

22 Claims, 7 Drawing Sheets

METHODS OF FORMING NON-CONTINUOUS CONDUCTIVE LAYERS FOR CONDUCTIVE STRUCTURES ON AN INTEGRATED CIRCUIT PRODUCT

BACKGROUND OF THE INVENTION

1. Field of the Invention

Generally, the present disclosure relates to the manufacture of sophisticated semiconductor devices, and, more specifically, to various methods of forming non-continuous conductive layers for conductive structures formed on an integrated circuit product and the resulting structures.

2. Description of the Related Art

The fabrication of advanced integrated circuits, such as CPUs, storage devices, ASICs (application specific integrated circuits) and the like, requires a large number of circuit elements, such as transistors, capacitors, resistors, etc., to be formed on a given chip area according to a specified circuit layout. During the fabrication of complex integrated circuits using, for instance, MOS (Metal-Oxide-Semiconductor) technology, millions of transistors, e.g., N-channel transistors (NFETs) and/or P-channel transistors (PFETs), are formed on a substrate including a crystalline semiconductor layer. A field effect transistor, irrespective of whether an NFET transistor or a PFET transistor is considered, typically includes doped source and drain regions that are formed in a semiconducting substrate and separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

To improve the operating speed of field effect transistors (FETs), and to increase the density of FETs on an integrated circuit device, device designers have greatly reduced the physical size of FETs over the past decades. More specifically, the channel length of FETs has been significantly decreased, which has resulted in improving the switching speed of FETs and the overall functionality of the circuit. Further scaling (reduction in size) of the channel length of transistors is anticipated in the future. While this ongoing and continuing decrease in the channel length of transistor devices has improved the operating speed of the transistors and integrated circuits that are formed using such transistors, there are certain problems that arise with the ongoing shrinkage of feature sizes that may at least partially offset the advantages obtained by such feature size reduction. For example, as the channel length is decreased, the pitch between adjacent transistors likewise decreases, thereby increasing the density of transistors per unit area. This scaling also limits the size of the conductive contact elements and structures, which has the effect of increasing their electrical resistance. In general, the reduction in feature size and increased packing density makes everything more crowded on modern integrated circuit devices.

Typically, due to the large number of circuit elements and the required complex layout of modern integrated circuits, the electrical connections of the individual circuit elements cannot be established within the same level on which the circuit elements, such as transistors, are manufactured. Rather, modern integrated circuit products have multiple so-called metallization layer levels that, collectively, contain the "wiring" pattern for the product, i.e., the conductive structures that provide electrical connection to the transistors and the circuits, such as conductive vias and conductive metal lines. In general, the conductive metal lines are used to provide intralevel (same level) electrical connections, while interlevel (between levels) connections or vertical connections are referred to as vias. In short, the vertically oriented conductive via structures provide the electrical connection between the various stacked metallization layers. Accordingly, the electrical resistance of such conductive structures, e.g., lines and vias, becomes a significant issue in the overall design of an integrated circuit product, since the cross-sectional area of these elements is correspondingly decreased, which may have a significant influence on the effective electrical resistance and overall performance of the final product or circuit.

Improving the functionality and performance capability of various metallization systems has also become an important aspect of designing modern semiconductor devices. One example of such improvements is reflected in the increased use of copper metallization systems in integrated circuit devices and the use of so-called "low-k" dielectric materials (materials having a dielectric constant less than about 3) in such devices. Copper metallization systems exhibit improved electrical conductivity as compared to, for example, prior metallization systems that used tungsten for the conductive lines and vias. The use of low-k dielectric materials tends to improve the signal-to-noise ratio (S/N ratio) by reducing cross-talk as compared to other dielectric materials with higher dielectric constants. However, the use of such low-k dielectric materials can be problematic as they tend to be less resistant to metal migration as compared to some other dielectric materials.

Copper is a material that is difficult to directly etch using traditional masking and etching techniques. Thus, conductive copper structures, e.g., conductive lines or vias, in modern integrated circuit devices are typically formed using known single or dual damascene techniques. FIGS. 1A-1B depict one illustrative prior art technique for forming a conductive copper structure. In general, the damascene technique involves: (1) forming one or more trenches/vias 12 in a layer of insulating material 14; (2) depositing one or more relatively thin barrier layers 16 (e.g., TiN, TaN); (3) forming an adhesion or wetting layer 18 (e.g., tantalum, ruthenium, etc.) on the barrier layer 16; (4) forming a copper seed layer (not shown) comprised of, for example, pure copper, copper-manganese, copper-aluminum, etc.; (5) forming a bulk copper material 20 across the substrate and in the trenches/vias 12; and (6) performing a chemical mechanical polishing process to remove the excess portions of the barrier layer 16, the adhesion layer 18 and the copper material 20 positioned outside of the trenches/vias 12 to define the illustrative final conductive copper structures 22 depicted in FIG. 1B. As is well known to those skilled in the art, the copper material 20 is typically formed by performing an electrochemical copper deposition process after a thin conductive copper seed layer (not shown in FIG. 1A) is deposited by physical vapor deposition on the adhesion layer 18.

However, as everything becomes more crowded on an integrated circuit product, problems may arise when manufacturing conductive structures employing traditional damascene techniques. More specifically, in conventional processing, the barrier layer 16, the liner layer 18 and the copper seed layer (not shown) all are formed as continuous individual layers, and the barrier layer 16 and the liner layer 18 are typically made of materials that are less conductive than copper. As the overall size of the conductive structure is reduced, the barrier layer 16 and the liner layer 18 occupy an increasing proportion of the space allowed for the overall conductive structure. Accordingly, the electrical resistance of the overall conductive structure increases. Additionally, the uniform barrier layers and liner layers used in high performance integrated circuit products are being manufactured to very small thicknesses that are about at the limits of the production equipment, i.e., it is difficult to continue to reduce the thickness of the barrier layers and the liner layers. Another problem encountered in manufacturing conductive structures using existing techniques is that the various anneals that are performed on the barrier layer 16 may result in the formation of so-called "open-pipe" copper diffusion paths in the barrier layer, and such anneals may weaken the interface between the barrier layer 16 and the layer of insulating material 14. Simply put, that anneal of the barrier layer 16 may cause uncontrolled recovery and re-crystallization of the microstructure of the material of the barrier layer 16. In some situations, semiconductor manufacturers have started to use materials such as ruthenium as the liner layer 18 to facilitate copper filling of the trench/via 12. While ruthenium improves copper filling characteristics, its use as an adhesion layer material is not without problems. Ruthenium typically causes a pseudo-corrosive reaction with tantalum, a common material in barrier layers. In turn, such a reaction may cause an undesirable increase in the resistance of the conductive structure, create open pathways in the barrier layer and generally degrade the overall quality of the barrier layer.

The present disclosure is directed to various methods of forming non-continuous conductive layers for conductive structures formed on an integrated circuit product, such as conductive lines/vias, that may solve or at least reduce some of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming non-continuous conductive layers for conductive structures formed on an integrated circuit product and the resulting structures. One illustrative method disclosed herein includes forming a trench/via in a layer of insulating material, forming a non-continuous layer comprised of a plurality of spaced-apart conductive structures on the layer of insulating material in the trench/via, wherein portions of the layer of insulating material not covered by the plurality of spaced-apart conductive structures remain exposed, forming at least one barrier layer on the non-continuous layer, wherein the barrier layer contacts the spaced-apart conductive structures and the exposed portions of the layer of insulating material, forming at least one liner layer above the barrier layer and forming a conductive structure in at least the trench/via above the liner layer.

Another illustrative method disclosed herein includes forming a trench/via in a layer of insulating material, forming a first non-continuous layer comprised of a plurality of first spaced-apart conductive structures on the layer of insulating material in the trench/via, wherein portions of the layer of insulating material not covered by the plurality of first spaced-apart conductive structures remain exposed, forming a barrier layer on the first non-continuous layer, wherein the barrier layer contacts the first spaced-apart conductive structures and the exposed portions of the layer of insulating material, forming a second non-continuous layer comprised of a plurality of second spaced-apart conductive structures on the barrier layer in the trench/via, wherein portions of the barrier layer not covered by the plurality of second spaced-apart conductive structures remain exposed, forming at least one liner layer on the second non-continuous layer, wherein the liner layer contacts the second spaced-apart conductive structures and the exposed portions of the barrier layer, and forming a conductive structure in the trench/via above the liner layer.

Yet another illustrative method disclosed herein includes forming a trench/via in a layer of insulating material, forming at least one barrier layer on the layer of insulating material, forming a non-continuous layer comprised of a plurality of spaced-apart conductive structures on the barrier layer in the trench/via, wherein portions of the barrier layer not covered by the plurality of spaced-apart conductive structures remain exposed, forming at least one liner layer on the non-continuous layer, wherein the liner layer contacts the spaced-apart conductive structures and the exposed portions of the at least one barrier layer, and forming a conductive structure in the trench/via above the liner layer.

One illustrative device disclosed herein includes a trench/via in a layer of insulating material, a plurality of spaced-apart conductive structures positioned on all surfaces of the layer of insulating material within the trench/via, a barrier layer that contacts the spaced-apart conductive structures and portions of the surfaces of the layer of insulating material between the plurality of spaced-apart conductive structures, a liner layer positioned above the barrier layer and a conductive structure positioned in the trench/via above the liner layer.

Another illustrative device disclosed herein includes a trench/via in a layer of insulating material, a barrier layer positioned on all surfaces of the layer of insulating material within the trench/via, a plurality of spaced-apart conductive structures positioned on all surfaces of the barrier layer within the trench/via, a liner layer that contacts the spaced-apart conductive structures and portions of the surfaces of the barrier layer between the plurality of spaced-apart conductive structures and a conductive structure positioned in the trench/via above the liner layer.

Yet another illustrative device disclosed herein includes a trench/via in a layer of insulating material, a first plurality of spaced-apart conductive structures positioned on all surfaces of the layer of insulating material within the trench/via, a barrier layer that contacts the first spaced-apart conductive structures and portions of the surfaces of the layer of insulating material between the first plurality of spaced-apart conductive structures, a second plurality of spaced-apart conductive structures positioned on all surfaces of the barrier layer within the trench/via, a liner layer that contacts the second spaced-apart conductive structures and portions of the surfaces of the barrier layer between the second plurality of spaced-apart conductive structures, and a conductive structure positioned in the trench/via above the liner layer.

BRIEF DESCRIPTION OF THE DRAWINGS

The disclosure may be understood by reference to the following description taken in conjunction with the accompanying drawings, in which like reference numerals identify like elements, and in which.

Figure 1A:
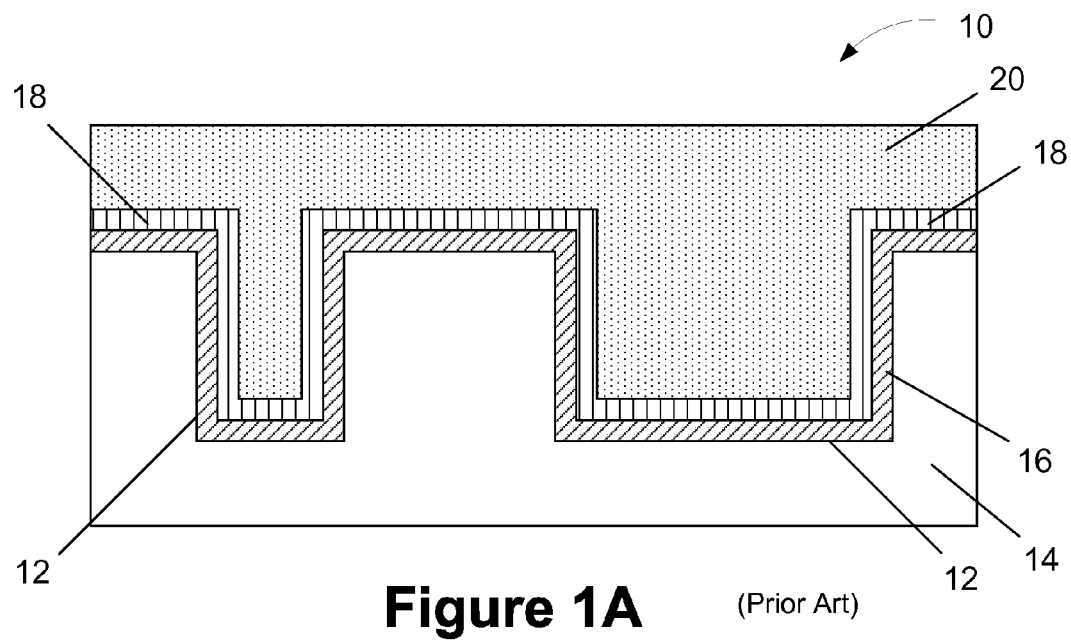
FIGS. 1A-1B depict an illustrative prior art method of forming conductive structures using a damascene process.
Figure 1B:
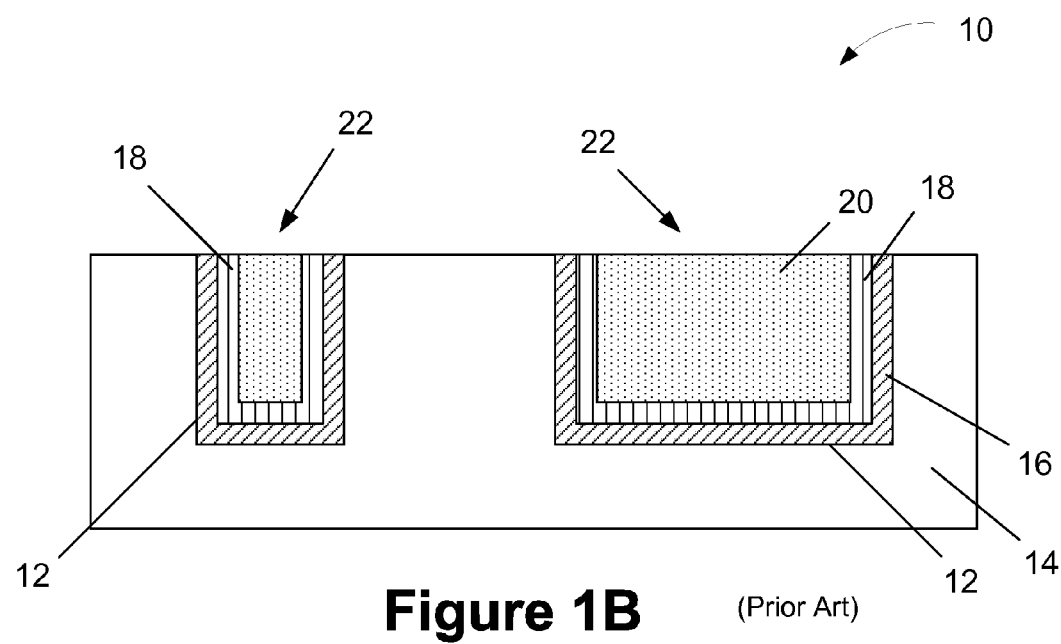

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming one or more non-continuous conductive layers in forming conductive structures for an integrated circuit product and the resulting structures. As will be readily apparent to those skilled in the art upon a complete reading of the present application, the present method is applicable to a variety of technologies, e.g., NFET, PFET, CMOS, etc., and is readily applicable to a variety of devices, including, but not limited to, ASIC's, logic devices, memory devices, etc. With reference to the attached drawings, various illustrative embodiments of the methods disclosed herein will now be described in more detail.

Figure 2A:
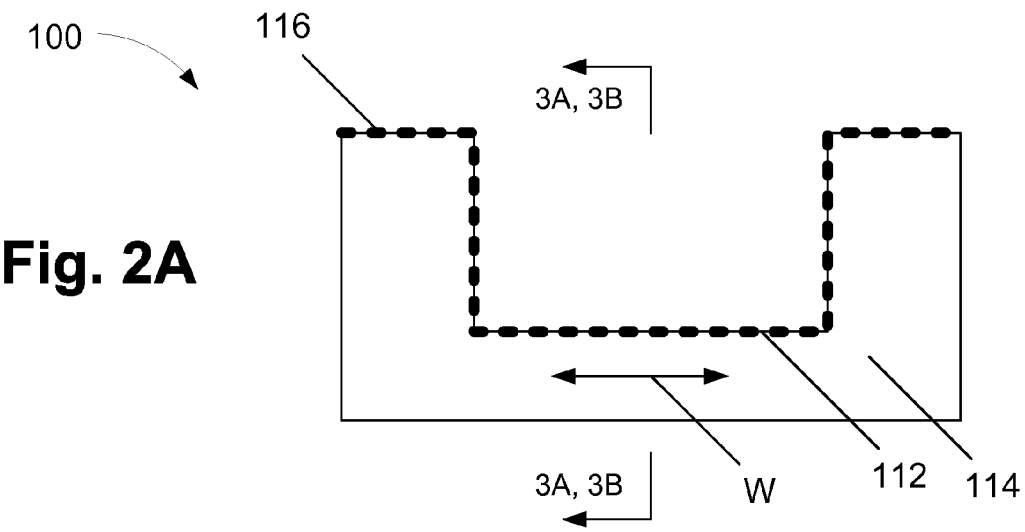
FIGS. 2A-2J depict various illustrative examples of the methods disclosed herein for forming non-continuous conductive layers for conductive structures formed on an integrated circuit product and various illustrative examples of the resulting structures.

FIG. 2A is a simplified view of an illustrative integrated circuit product or device 100 at an early stage of manufacturing that is formed above a semiconductor substrate (not shown). The substrate may have a variety of configurations, such as a bulk substrate configuration, an SOI (silicon-on-insulator) configuration, and it may be made of materials other than silicon. Thus, the terms "substrate" or "semiconductor substrate" should be understood to cover all semiconducting materials and all forms of such materials. The device 100 may be any type of integrated circuit device that employs any type of a conductive structure, such as a conductive line or via, commonly found on integrated circuit devices.

Figure 2B:
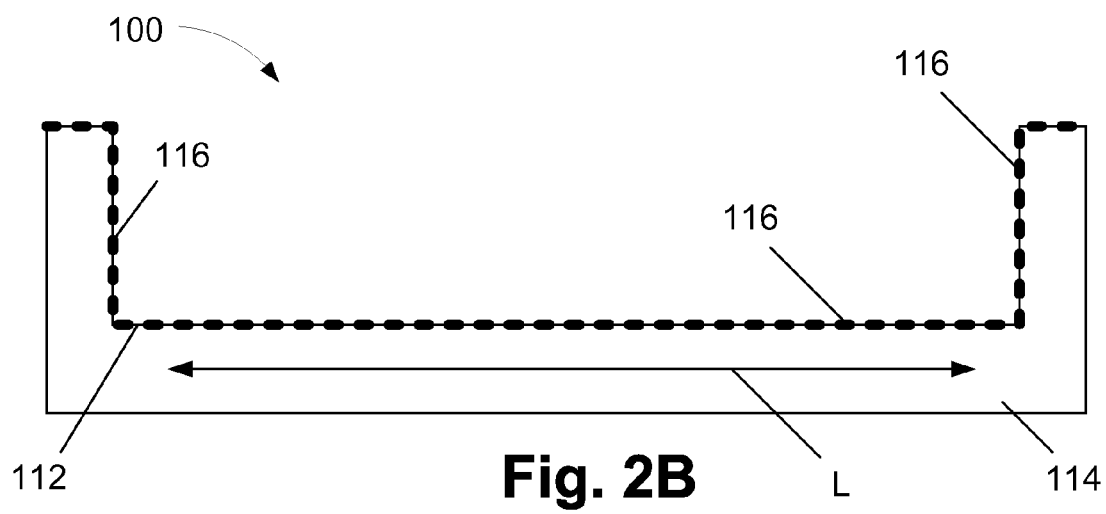

At the point of fabrication depicted in FIG. 2A, a trench/via 112 has been formed in a layer of insulating material 114 by performing known photolithography and etching techniques through a patterned mask layer (not shown). FIG. 2A is a cross-sectional view taken across the width (W) of the trench/via 112, while FIG. 2B is a cross-sectional view taken across the length (L) of the trench/via 112. The trench/via 112 is intended to be representative of any type of opening formed in any type of insulating material 114 wherein a conductive structure, e.g., a copper-based structure, may be formed. The trench/via 112 may be of any desired shape, depth, width, length or configuration. For example, in some embodiments, the trench/via 112 is a classic trench that does not extend all of the way through to an underlying layer of material, such as the illustrative trench 112 depicted in FIG. 2A. In other embodiments, the trench/via 112 may be a through-hole type feature, e.g., a classic via, that extends all of the way through the layer of insulating material 114 and exposes an underlying layer of material or an underlying conductive structure (not shown), such as an underlying metal line. Thus, the shape, size, depth, length, width or configuration of the trench/via 112 should not be considered to be a limitation of the presently disclosed inventions. The trench/via 112 may be formed by performing any of a variety of different etching processes, e.g., a dry reactive ion etching process, through the patterned mask layer.

The various components and structures of the device 100 may be initially formed using a variety of different materials and by performing a variety of known techniques. For example, the layer of insulating material 114 may be comprised of any type of insulating material, e.g., silicon dioxide, a low-k insulating material (k value less than 3.3), etc., it may be formed to any desired thickness and it may be formed by performing, for example, a chemical vapor deposition (CVD) process, atomic layer deposition (ALD) process, a spin-on deposition (SOD) process, etc.

With continuing reference to FIG. 2A, a deposition process, e.g., a conformal CVD or ALD process, is performed to form a schematically depicted non-continuous layer of conductive material 116 across the product 100 and in the trench/via 112. The non-continuous layer of conductive material 116 is formed on all surfaces of the layer of insulating material 114 that were exposed when the trench/via 112 was formed. In general, as described more fully below, the non-continuous layer of conductive material 116 is comprised of a plurality of spaced-apart conductive structures that, while covering portions of the layer of insulating material 114, leave other portions of the layer of insulating material 114 exposed. That is, the non-continuous layer of conductive material 116 is formed such that it intentionally does not cover the entire surface of the layer of insulating material 114 within the trench/via 112. Thus, the formation of the non-continuous layer of conductive material 116 described herein is clearly unlike the traditional practice employed in forming continuous, uninterrupted layers of conductive materials, e.g., barrier layers and liner layers, when forming conductive structures on an integrated circuit device.

Figure 2C:
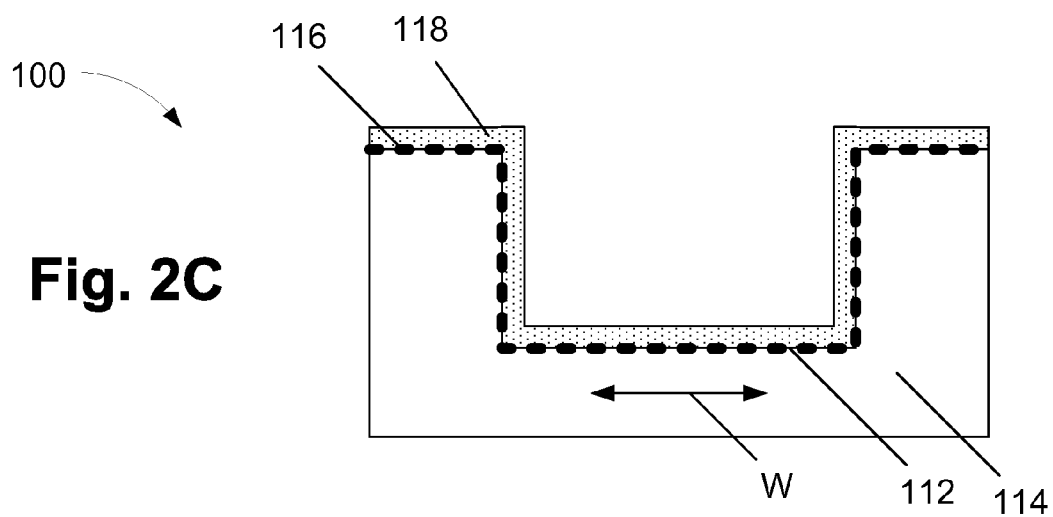

As shown in FIG. 2C, another deposition process, e.g., a conformal PVD, CVD or ALD process, is then performed to form at least one barrier layer 118 on the non-continuous layer of conductive material 116 and the exposed portions of the layer of insulating material 114. Since the spaced-apart conductive structures of the non-continuous layer of conductive material 116 do not cover all of the surface of the layer of insulating material 114 within the trench/via 112, the barrier layer 118 contacts both the spaced-apart conductive structures of the non-continuous layer of conductive material 116 and the exposed portions of the layer of insulating material 114. The barrier layer 118 depicted in FIG. 2C is intended to be representative of any type of barrier layer or combinations of barrier layers that may be employed in manufacturing conductive structures on integrated circuit products, i.e., the "barrier layer" referenced herein and in the claims may be comprised of a single layer of barrier material or multiple layers of barrier material. The barrier layer 118 may be comprised of a variety of materials, e.g., tantalum nitride (TaN), TaC, TaSi, WBN, CoWP, etc. The thickness of the barrier layer 118 may vary depending upon the particular application, e.g., it may have a thickness of about 0.5-2 nm.

Figure 2D:
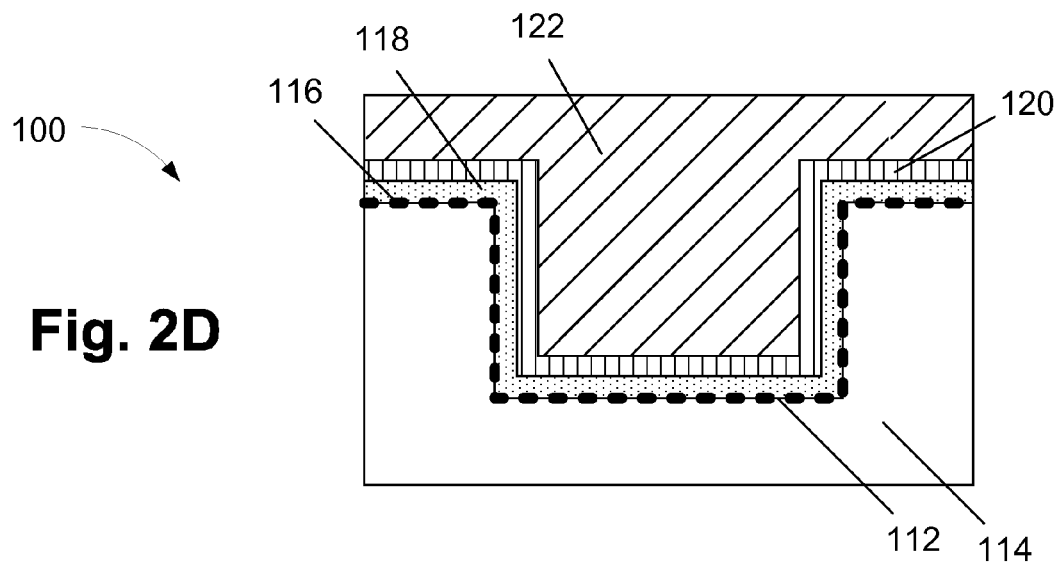

FIG. 2D depicts the product after several process operations have been performed on the product 100. First, another deposition process, e.g., a conformal PVD, CVD or ALD process, was performed to form at least one liner layer 120 on the barrier layer 118. The liner layer 120 depicted in FIG. 2D is intended to be representative of any type of liner layer or combinations of liner layers that may be employed in manufacturing conductive structures on integrated circuit products, i.e., the "liner layer" referenced herein and in the claims may be comprised of a single layer of liner material or multiple layers of liner material. The liner layer 120 may be comprised of a variety of materials, e.g., tantalum, ruthenium, cobalt, titanium, tungsten or a combination these materials, etc. The thickness of the liner layer 120 may vary depending upon the particular application, e.g., it may have a thickness of about 0.5-2 nm. Thereafter, various operations were undertaken so as to ultimately form a conductive material, e.g., copper, a copper-based alloy, copper oxynitride, etc., in the trench/via 112 above the liner layer 120. For example, in one embodiment, forming the conductive material may involve forming a copper or copper alloy seed layer (not shown), e.g., copper-manganese, copper-aluminum, etc., on the liner layer 118, and thereafter forming bulk copper or copper-based alloy material 122 so as to overfill the trench/via 112 using any of a variety of well-known processes, e.g., electroplating, electroless deposition, copper reflow, etc.

Figure 2E:
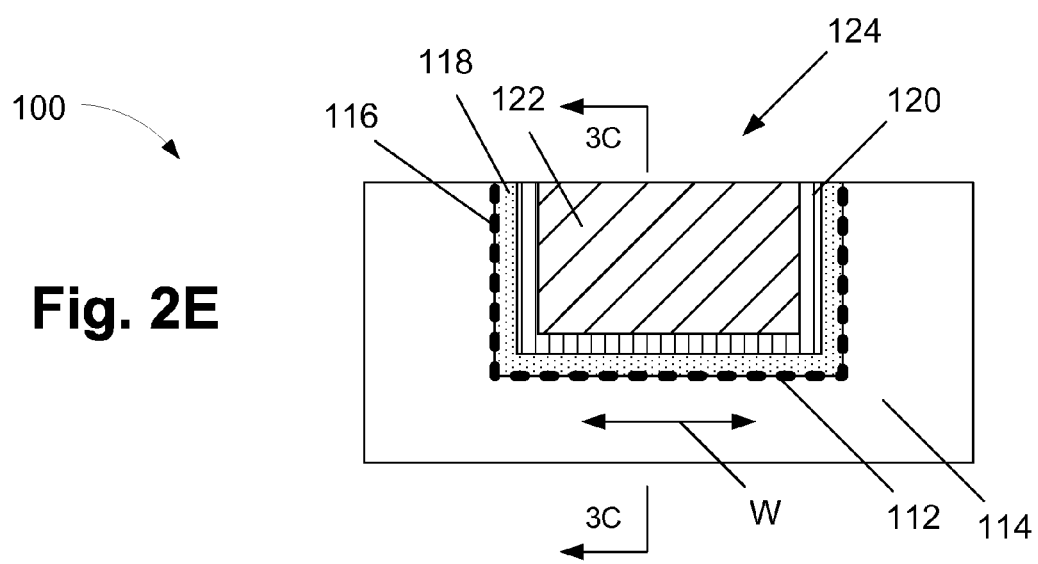
Figure 2F:
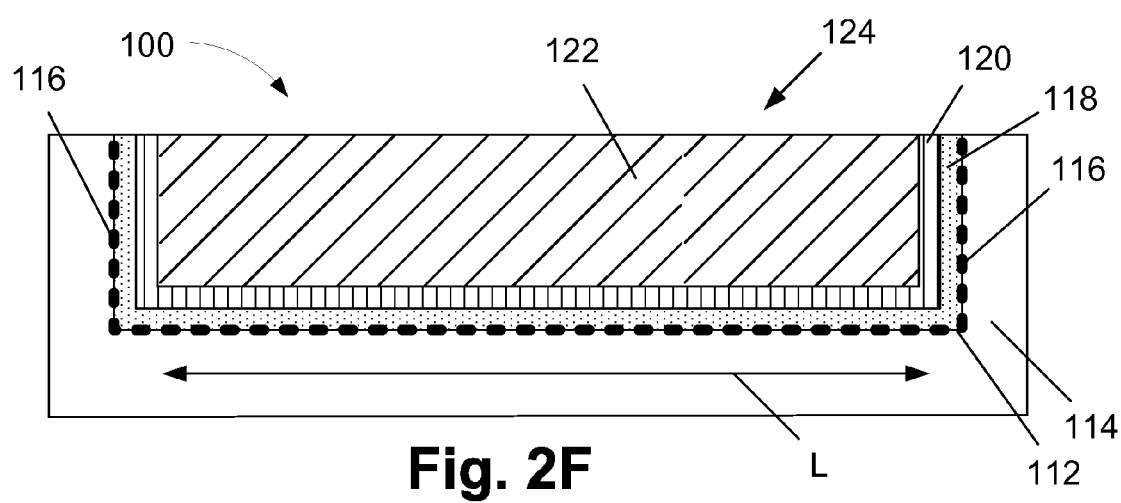

FIG. 2E depicts the product 100 after one or more CMP processes were performed to remove excess materials positioned above the surface of the layer of insulating material 114 and outside of the trench/via 112. These process operations result in the illustrative conductive structure 124 shown in FIGS. 2E-2F.

Figure 2G:
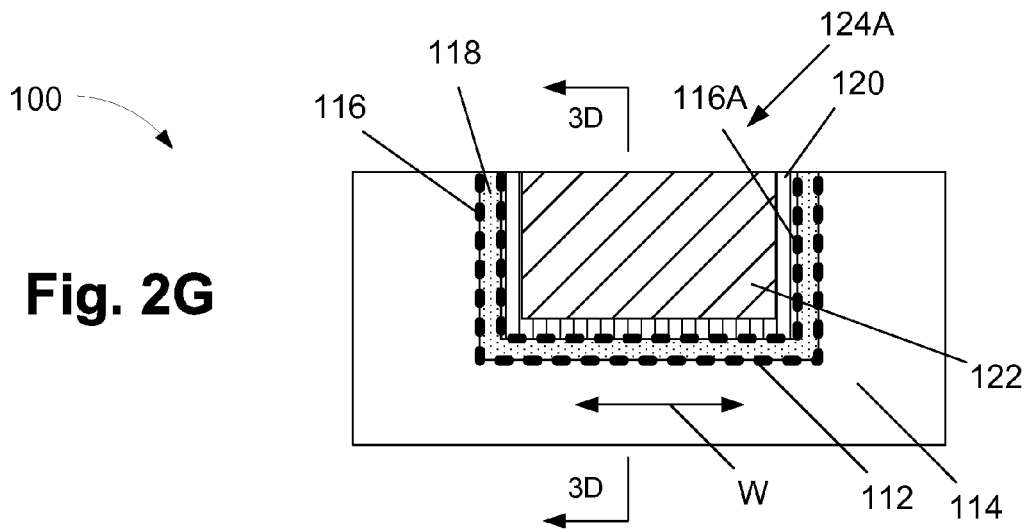
Figure 2H:
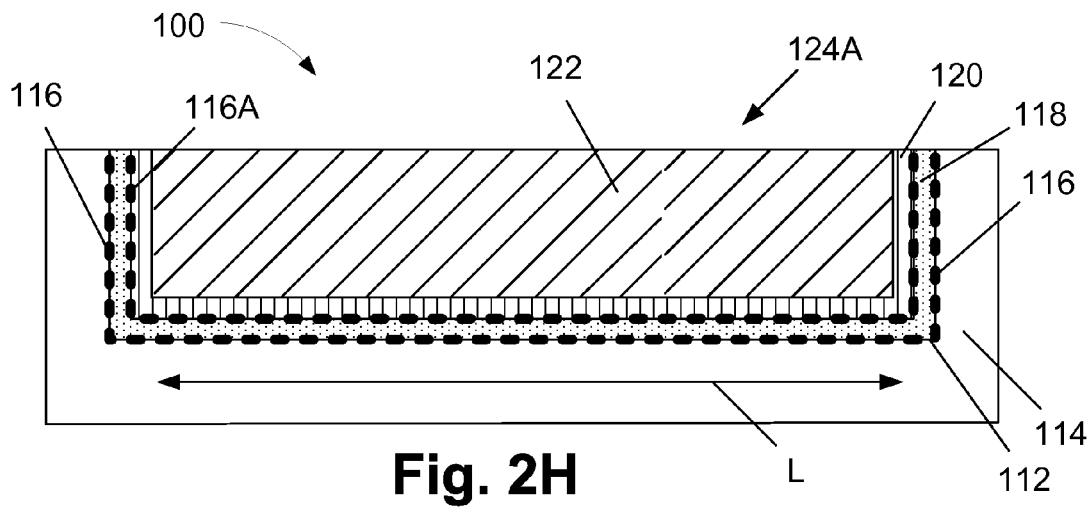

FIGS. 2G-2H depict another illustrative embodiment of a conductive contact structure 124A disclosed herein. FIG. 2G is a cross-sectional view taken across the width (W) of the trench/via 112, while FIG. 2H is a cross-sectional view taken across the length (L) of the trench/via 112. In this embodiment, first and second non-continuous layers of conductive material 116, 116A are formed in making the conductive structure 124A. The conductive structure 124A is basically the same as the conductive structure shown in FIGS. 2E-2F with the noted addition of the second non-continuous layer of conductive material 116A that is formed on the barrier layer 118, i.e., between the barrier layer 118 and the liner layer 120. The spaced-apart conductive structures (discussed more fully below) of the second non-continuous layer of conductive material 116A may be comprised of the same or a different material than the material of the spaced-apart conductive structures of the first non-continuous layer of conductive material 116. The second non-continuous layer of conductive material 116A is formed on all surfaces of the barrier layer 118 within at least the trench/via 112. As indicated, the second non-continuous layer of conductive material 116A is comprised of a plurality of spaced-apart conductive structures that, while covering portions of the barrier layer 118, leave other portions of the barrier layer 118 exposed. That is, the second non-continuous layer of conductive material 116A is formed such that it intentionally does not cover the entire surface of barrier layer 118 within the trench/via 112. Thus, the formation of the second non-continuous layer of conductive material 116A is clearly unlike the traditional practice employed in forming continuous, uninterrupted layers of conductive materials, e.g., barrier layers and liner layers, when forming conductive structures on an integrated circuit device. In this embodiment, the liner layer 120 is formed on the second non-continuous layer of conductive material 116A. Since the spaced-apart conductive structures of the second non-continuous layer of conductive material 116A do not cover all of the surface of the barrier layer 118 within the trench/via 112, the liner layer 120 contacts both the spaced-apart conductive structures of the second non-continuous layer of conductive material 116A and the exposed portions of the barrier layer 118.

Figure 2I:
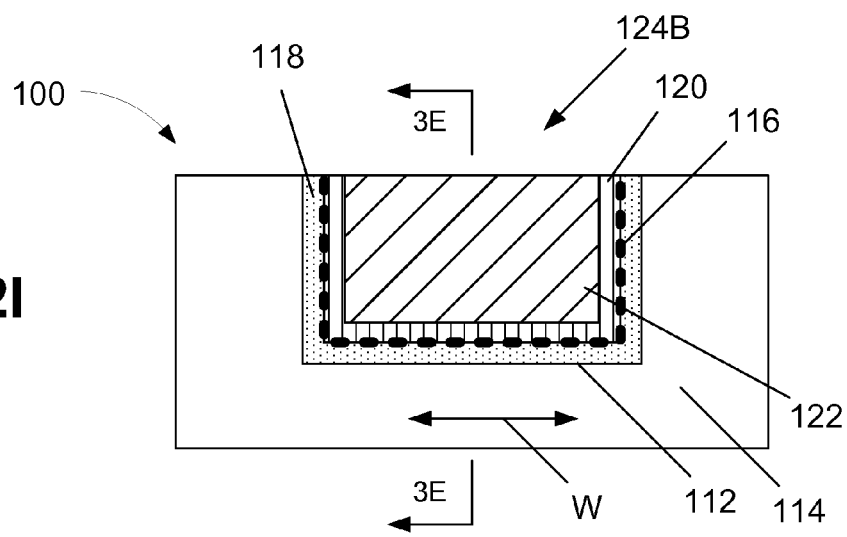
Figure 2J:
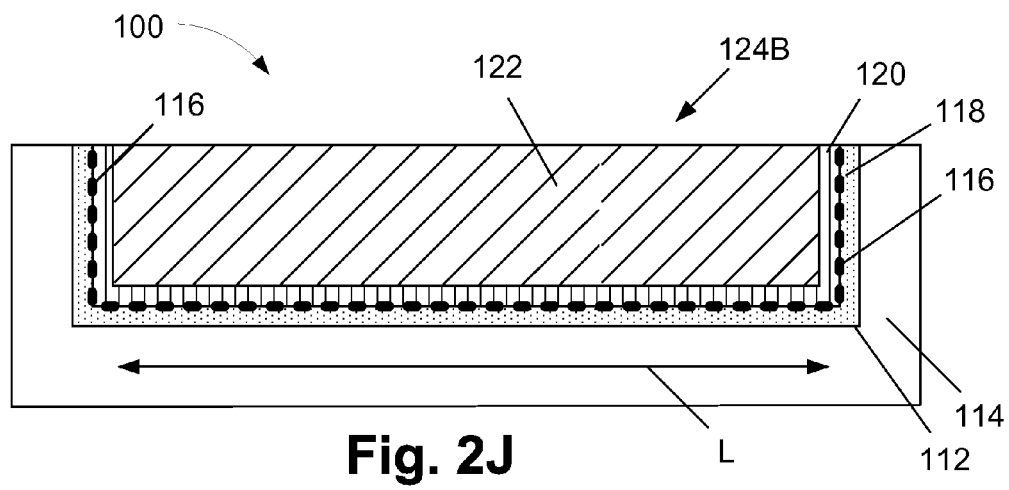

FIGS. 2I-2J depict another illustrative embodiment of a conductive contact structure 124B disclosed herein. FIG. 2I is a cross-sectional view taken across the width (W) of the trench/via 112, while FIG. 2J is a cross-sectional view taken across the length (L) of the trench/via 112. The conductive structure 124B is basically the same as the conductive structure 124 shown in FIGS. 2E-2F with the noted exceptions that the barrier layer 118 is formed on the layer of insulating material 114 and the only non-continuous layer of conductive material 116 in the conductive structure 124B is formed on the barrier layer 118, i.e., between the barrier layer 118 and the liner layer 120. The non-continuous layer of conductive material 116 shown in FIGS. 2I-2J is formed on all surfaces of the barrier layer 118 within at least the trench/via 112. As with the embodiment depicted in FIGS. 2G-2H, the liner layer 120 contacts both the spaced-apart conductive structures of the non-continuous layer of conductive material 116 and the exposed portions of the barrier layer 118.

Figure 3A:
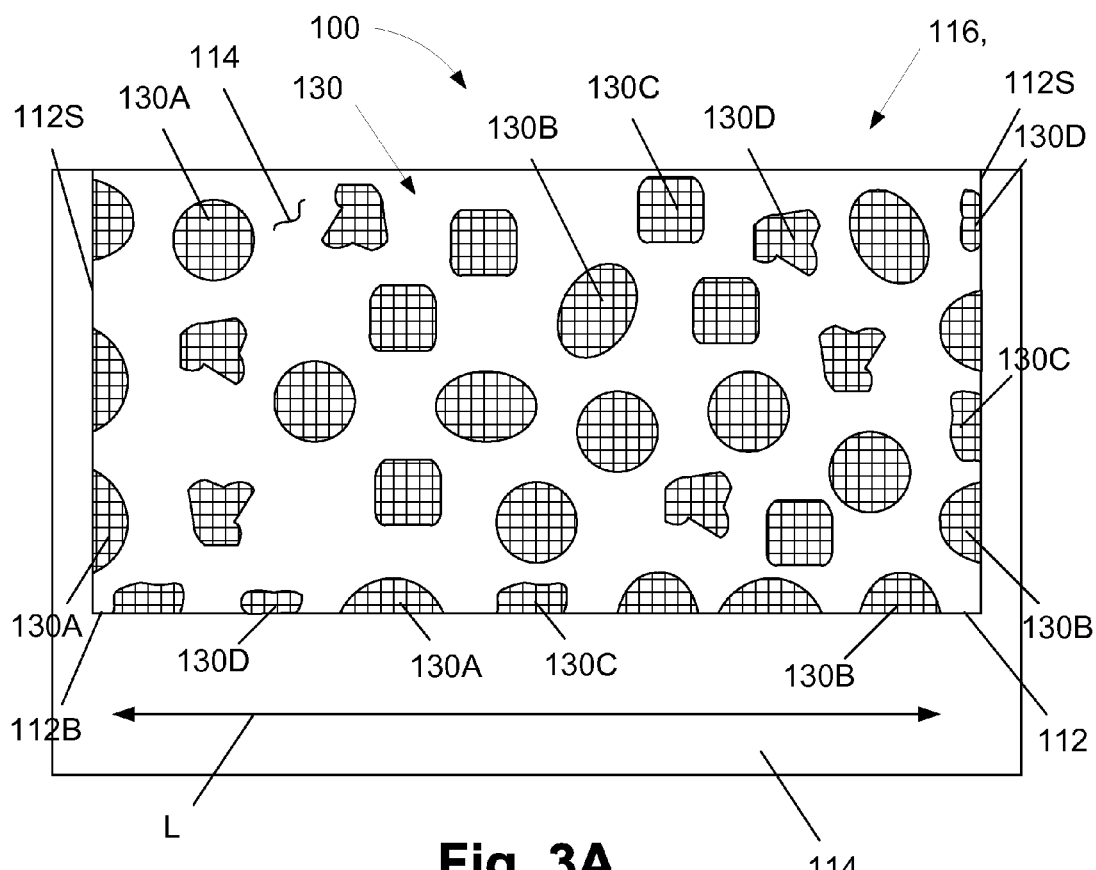
FIGS. 3A-3E are enlarged cross-sectional views depicting various illustrative examples of the methods disclosed herein for forming non-continuous conductive layers and the devices resulting therefrom.
Figure 3B:
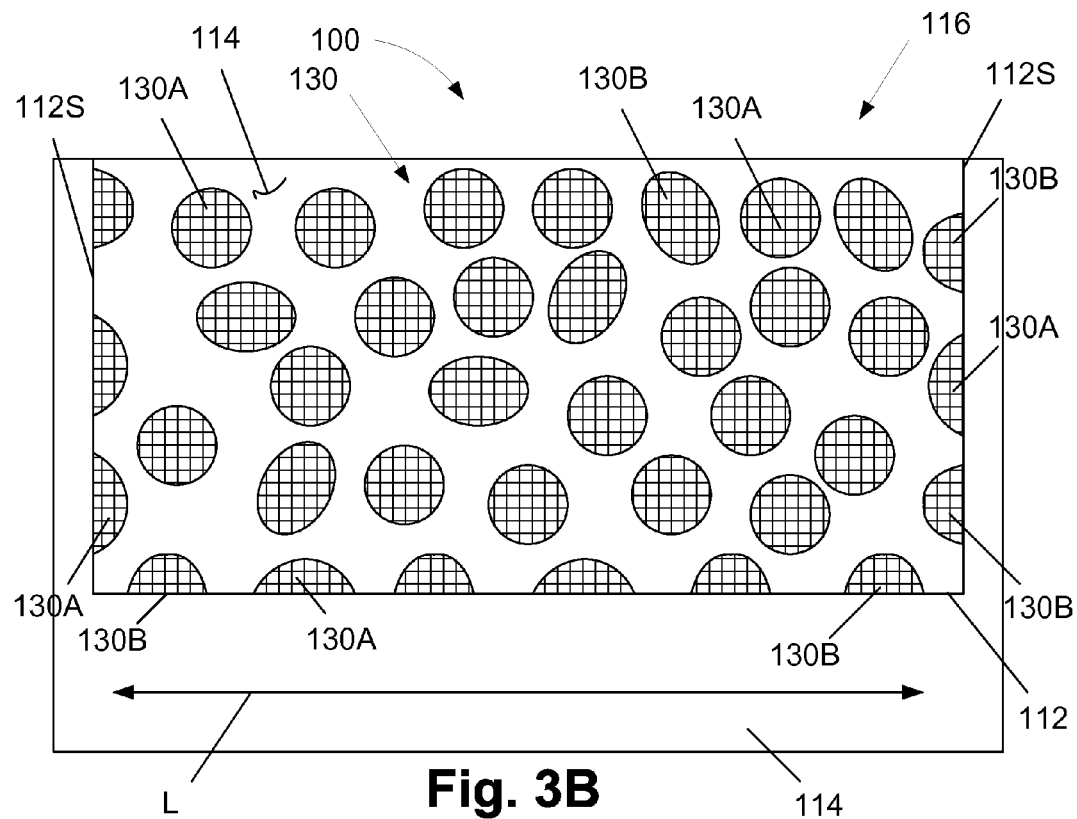
Figure 3C:
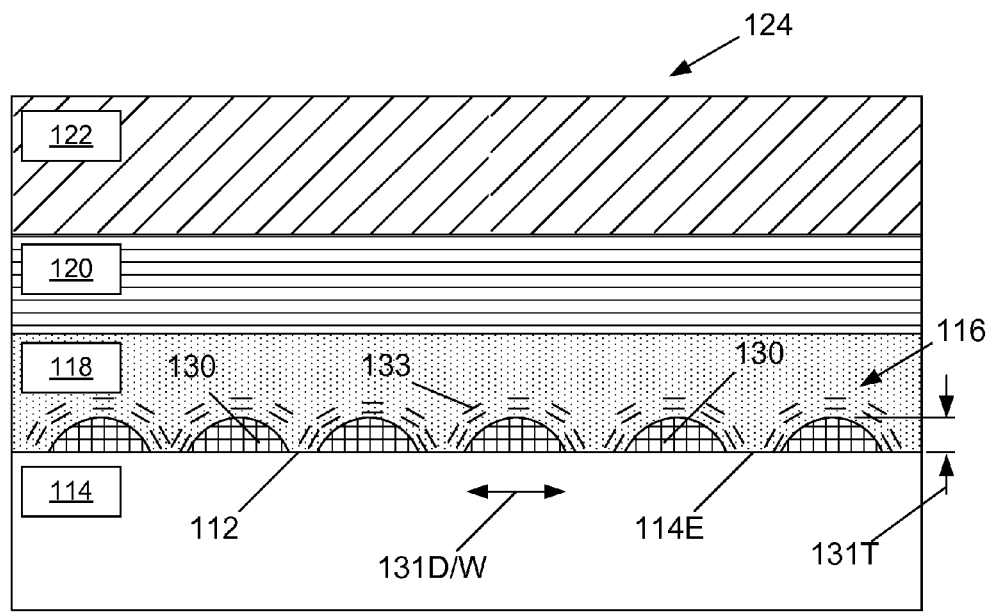
Figure 3D:
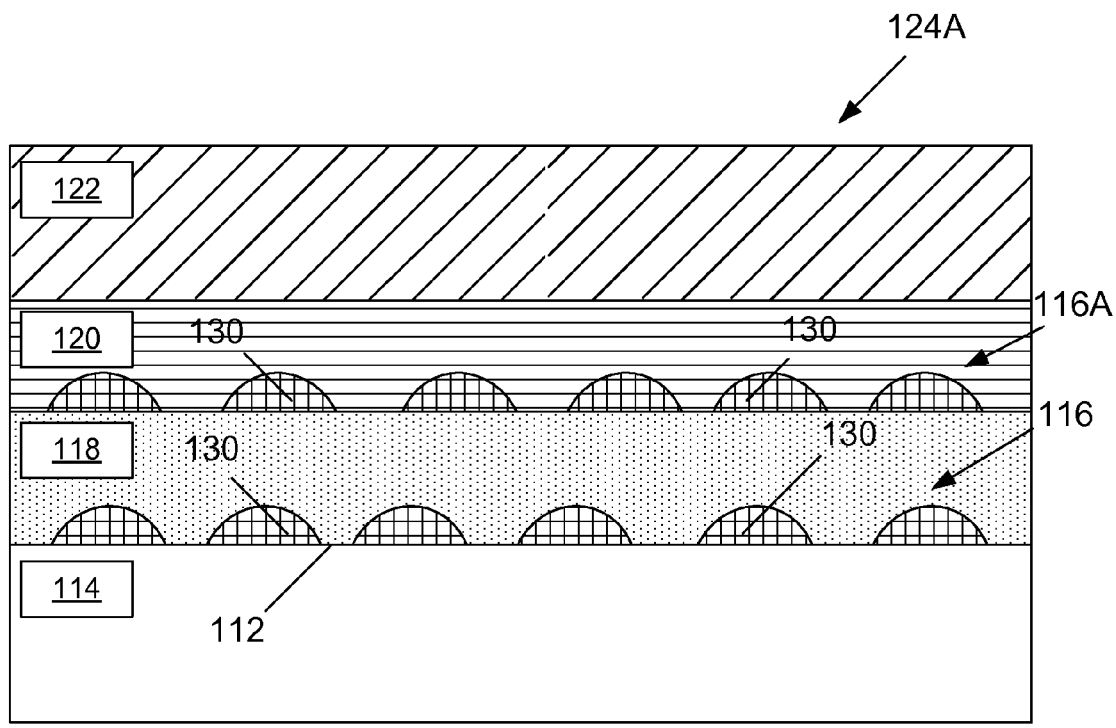
Figure 3E:
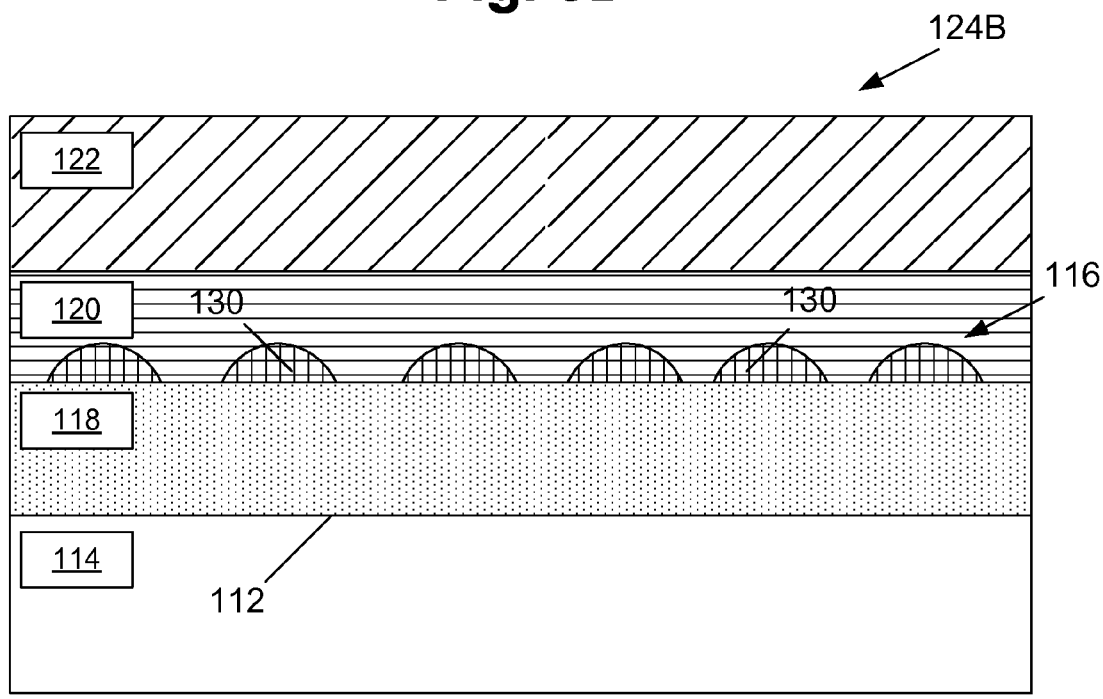

FIGS. 3A-3E are enlarged cross-sectional views depicting various illustrative examples of the methods disclosed herein for forming the non-continuous conductive layers 116, 116A and the conductive structures 124, 124A and 124B described above. FIGS. 3A-3B are cross-sectional views taken where indicated in FIG. 2A. The cross-sectional views in FIGS. 3C, 3D and 3E are taken where indicated in FIGS. 2E, 2G and 2I, respectively. In these drawings, the trench/via 112 is comprised of a bottom surface 112B and a plurality of side surfaces 112S. Although FIGS. 3A-3B make reference to only the non-continuous layer of conductive material 116, the discussion applies equally as well to the second non-continuous layer of conductive material 116A (that is formed on the barrier layer 118).

As noted above, the non-continuous layer of conductive material 116 is comprised of a plurality of spaced-apart conductive structures 130 that are formed on the layer of insulating material 114. That is, the spaced-apart conductive structures 130 are formed on the sidewalls and the bottom surface of the illustrative trench/via 112 shown in FIG. 3A. In the situation where the trench/via 112 is a through-hole via, the spaced-apart conductive structures 130 would only be formed on the sidewalls of the opening. In the case where the second non-continuous layer of conductive material 116A is formed, the spaced-apart conductive structures 130 are formed on top of the bottom and side surfaces of the barrier layer 118. The spaced-apart conductive structures 130 may be comprised of any conductive material, e.g., a metal, a metal alloy, polysilicon, tantalum-titanium (TaTi), a nitride metal, an oxynitrided metal, etc., and they may be of any shape or configuration when viewed in either cross-section or from above. In the illustrative example depicted in FIG. 3A, the spaced-apart conductive structures 130 may have a substantially circular 130A, substantially oval 130B, substantially rectangular 130C and/or an irregular 130D shape when viewed from above. The spacing between adjacent spaced-apart conductive structures 130 may be random or substantially uniform. The spaced-apart conductive structures 130 may be arranged in a semiordered arrangement or they may be arranged in a random, non-ordered fashion, as depicted in FIG. 3A. FIG. 3B depicts an illustrative example where the spaced-apart conductive structures 130 are comprised primarily of circular and oval shaped structures, 130A, 130B.

As shown in FIG. 3C, the spaced-apart conductive structures 130 of the non-continuous layer of conductive material 116 are formed on the surface of the layer of insulating material 114 within the trench/via 112. As noted above, the spaced-apart conductive structures 130 are formed in such a manner that, while they cover portions of the exposed surface of the layer of insulating material 114 within the trench/via 112, they leave other portions 114E of the surface of the layer of insulating material 114 within the trench/via 112 exposed. As depicted in this example, the barrier layer 118 contacts both the spaced-apart conductive structures 130 and the exposed portions of the surface of the layer of insulating material 114 within the trench/via 112.

In general, the height 131T and the diameter/width/lateral dimension 131D/W of the spaced-apart conductive structures 130 may vary depending upon the particular application. In one illustrative example, the height 131T may be on the order of about 0.5 nm or less, while the diameter/width/lateral dimension 131D/W may be on the order of about 1 nm or less. The non-continuous layer of conductive material 116 may be formed by performing a CVD, PVD or ALD process. Importantly, the process is performed in such a manner that the non-continuous layer of conductive material 116 intentionally does not cover the entire surface of the layer of insulating material 114 within the trench/via 112. In one embodiment, this is accomplished by performing a PVD or CVD deposition process for a very short period of time and/or performing the process such that it exhibits a very low deposition rate. In the case of an ALD process, this may be accomplished by only performing a few or a limited number of deposition cycles. In some cases, a low deposition temperature may also be employed. The process used in forming the non-continuous layer of conductive material 116 is contrary to the traditional practice of forming continuous barrier/liner layers that typically involve, for CVD and PVD processes, relatively long deposition times and moderate deposition rates and, for an ALD process, performing many deposition cycles to achieve the desired continuous layer formation and coverage. Thus, the formation of the non-continuous layer of conductive material 116 is clearly contrary to traditional practices employed in forming continuous, uninterrupted layers of conductive materials, e.g., barrier layers and liner layers, when forming conductive structures on an integrated circuit device, where great efforts are made to cover the entire surface of the layer of insulating material 114 within the trench/via 112 with a continuous layer of conductive material.

With continuing reference to FIG. 3C, after the barrier layer 118 comprised of, for example, tantalum nitride (TaN) is formed, an anneal process is performed on the product 100.

In one illustrative example, the anneal process may be performed in a traditional furnace at a temperature that falls within the range of about 100-400° C. for a duration of about 1-60 minutes in an inert ambient. The anneal process serves several purposes. First, in the case where the spaced-apart conductive structures 130 are comprised of tantalum-titanium (TaTi), the titanium in the spaced-apart conductive structures 130 out-diffuses (as reflected by the lines 133) and acts to attach or "pin" the spaced-apart conductive structures 130 to the layer of insulating material 114. Second, the out-diffusion 133 of titanium into the surrounding tantalum nitride fibers in the barrier layer 118 further enhances the barrier properties of the tantalum nitride material (between TaTi basal grains). After the anneal process is performed, the recovery/re-crystallization process occurs without a driving force to form undesirable super-size grains, thereby reducing or eliminating surface roughness at the interface between the barrier layer and the liner layer, which tends to reduce electron scattering at the interface between the barrier layer and the liner layer and also between the liner layer and the conductive fill material, thereby resulting in a decrease in the overall resistance.

Still referencing FIG. 3C, in one particular embodiment, the non-continuous layer 116 is formed so that spaced-apart conductive structures 130 exhibit a first type of stress, and the barrier layer 118 is formed so as to exhibit a second type of stress that is opposite to the first type of stress. As a specific example, where the spaced-apart conductive structures 130 are comprised of tantalum-titanium (TaTi) and the barrier layer 118 is comprised of tantalum nitride (TaN), the spaced-apart conductive structures 130 may be formed so as to exhibit a tensile stress, while the barrier layer 118 may be formed so as to exhibit a compressive stress. In some applications, the stresses may be reversed. Forming the spaced-apart conductive structures 130 and the barrier layer 118 with opposite stresses tends to lock the grains together more effectively and tends to arrest the formation of any pipe diffusion pathways. The manner in which the spaced-apart conductive structures 130 and the barrier layer 118 may be formed with the desired stress characteristics are well known to those skilled in the art.

FIG. 3D is an enlarged cross-sectional view of the conductive structure 124A that is comprised of the first and second non-continuous layers of conductive material 116, 116A. As noted above, the spaced-apart conductive structures 130 of the second non-continuous layer of conductive material 116A may be comprised of the same or a different material as the material of the spaced-apart conductive structures 130 of the first non-continuous layer of conductive material 116. In this particular example, the above-described anneal process may be performed only once, i.e., after the liner layer 120 is formed, or it may be performed twice, once after the formation of the barrier layer 118 and again after the formation of the liner layer 120. So as not to obscure the drawing, the schematically depicted out-diffusion of material from the spaced-apart conductive structures 130 is not depicted in FIG. 3D. Additionally, if desired, the stresses of the spaced-apart conductive structures 130 in the layers 116, 116A and the barrier layer 118 and/or liner layer 120 may be mixed and matched in any desired arrangement depending upon the particular application.

FIG. 3E is an enlarged cross-sectional view of the conductive structure 124B that is comprised of the non-continuous layer of conductive material 116 positioned between the barrier layer 118 and the liner layer 120. In this particular example, the above-described anneal process may be performed after the formation of the liner layer 120. So as not to obscure the drawing, the schematically depicted out-diffusion of material from the spaced-apart conductive structures 130 is not depicted in FIG. 3E. Additionally, if desired, the stresses of the spaced-apart conductive structures 130 in the layer 116 and the liner layer 120 may be mixed and matched in any desired arrangement depending upon the particular application.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a trench/via in a layer of insulating material, inside surfaces of said trench/via exposing said layer of insulating material;
    performing one of a chemical vapor deposition (CVD) process, a physical vapor deposition (PVD) process, and an atomic layer deposition (ALD) process to form a non-continuous layer comprised of a plurality of spaced-apart conductive structures on said layer of insulating material in said trench/via, wherein portions of said layer of insulating material exposed by said inside surfaces of said trench/via are not covered by said plurality of spaced-apart conductive structures and remain exposed after forming said non-continuous layer;
    performing at least one of a CVD, PVD and ALD process to form at least one barrier layer on said non-continuous layer, said at least one barrier layer contacting said spaced-apart conductive structures and said remaining exposed portions of said layer of insulating material inside of said trench/via;
    forming at least one liner layer above said at least one barrier layer; and
    forming a conductive structure in at least said trench/via above said at least one liner layer.

2. The method of claim 1, wherein said spaced-apart conductive structures are comprised of a metal.

3. The method of claim 1, wherein said spaced-apart conductive structures are comprised of at least one of a metal, a metal alloy, polysilicon, tantalum-titanium (TaTi), a nitride metal or an oxynitrided metal.

4. The method of claim 1, wherein said non-continuous layer is formed on all inside surfaces of said trench/via exposing said layer of insulating material.

5. The method of claim 1, wherein said non-continuous layer is formed so that said plurality of spaced-apart conductive structures exhibit a first type of stress, and said at least one barrier layer is formed so as to exhibit a second type of stress that is opposite to said first type of stress.

6. The method of claim 1, wherein, prior to forming said at least one liner layer, forming a second non-continuous layer comprised of a second plurality of spaced-apart conductive structures above said at least one barrier layer, and wherein forming said at least one liner layer comprises forming said at least one liner layer such that it contacts at least said second plurality of spaced-apart conductive structures of said second non-continuous layer.

7. The method of claim 6, wherein said plurality of spaced-apart conductive structures of said non-continuous layer and said second plurality of spaced-apart conductive structures of said second non-continuous layer are comprised of the same material.

8. The method of claim 6, wherein said plurality of spaced-apart conductive structures of said non-continuous layer and said second plurality of spaced-apart conductive structures of said second non-continuous layer are comprised of different materials.

9. The method of claim 1, further comprising performing an anneal process after forming said at least one barrier layer, wherein said anneal process is performed at a temperature that falls within the range of 100-400° C.

10. The method of claim 1, wherein said at least one barrier layer is comprised of tantalum nitride (TaN), TaC, TaSi, WBN or CoWP.

11. The method of claim 1, wherein said at least one liner layer is comprised of tantalum, ruthenium, cobalt, titanium, tungsten or a combination of the forgoing materials.

12. The method of claim 1, wherein said conductive structure positioned in said trench/via above said at least one liner layer is comprised of copper.

13. The method of claim 1, wherein forming said at least one liner layer above said at least one barrier layer comprises performing at least one of a CVD, PVD, and ALD process.

14. A method, comprising:
    forming a trench/via in a layer of insulating material, wherein said layer of insulating material is comprised of a low-k insulating material having a k value less than 3.3 and wherein inside surfaces of said trench/via expose said layer of insulating material;
    performing one of a chemical vapor deposition (CVD) process, a physical vapor deposition (PVD) process, and an atomic layer deposition (ALD) process to form a non-continuous layer comprised of a plurality of spaced-apart metal-containing conductive structures on said layer of insulating material in said trench/via, wherein portions of said layer of insulating material exposed by said inside surfaces of said trench/via are not covered by said plurality of spaced-apart conductive structures and remain exposed after forming said non-continuous layer;
    performing one of a CVD, PVD and ALD process to form a barrier layer on said non-continuous layer, said barrier layer contacting said spaced-apart conductive structures and said remaining exposed portions of said layer of insulating material inside of said trench/via;
    forming a liner layer above said barrier layer; and
    forming a conductive copper structure in at least said trench/via above said liner layer.

15. The method of claim 14, wherein said non-continuous layer is formed on all inside surfaces of said trench/via exposing said layer of insulating material.

16. The method of claim 14, wherein said non-continuous layer is formed so that said plurality of spaced-apart conductive structures exhibit a first type of stress, and said barrier layer is formed so as to exhibit a second type of stress that is opposite to said first type of stress.

17. The method of claim 14, wherein forming said liner layer above said barrier layer comprises performing at least one of a CVD, PVD, and ALD process.

18. A method, comprising:
    forming a trench/via in a layer of insulating material, said trench/via comprising bottom and sidewall surfaces;
    forming a conductive material layer system in said trench/via such that said conductive material layer system is formed above said bottom surface and adjacent to said sidewall surfaces, wherein forming said conductive material layer system comprises:

performing at least one of a chemical vapor deposition (CVD) process, a physical vapor deposition (PVD) process, and an atomic layer deposition (ALD) process to form a first non-continuous layer comprised of a plurality of first spaced-apart conductive structures;

performing at least one of a CVD, PVD and ALD process to form at least one barrier layer;

performing at least one of a chemical vapor deposition (CVD) process, a physical vapor deposition (PVD) process, and an atomic layer deposition (ALD) process to form a second non-continuous layer comprised of a plurality of second spaced-apart conductive structures; and performing at least one of a CVD, PVD and ALD process to form at least one liner layer, wherein one of said at least one barrier layer and said at least one liner layer is in contact with at least said plurality of first spaced-apart conductive structures of said first non-continuous layer; and forming a conductive structure in at least said trench/via and above said conductive material layer system.

19. The method of claim 18, wherein said at least one liner layer is formed above at least one of said first and second non-continuous layers and above said at least one barrier layer.

20. The method of claim 18, wherein one of said first and second non-continuous layers is formed between said layer of insulating material and said at least one barrier layer.

21. The method of claim 18, wherein one of said first and second non-continuous layers is formed between said at least one barrier layer and said at least one liner layer.

22. The method of claim 18, wherein said first non-continuous layer is formed between said layer of insulating material and said at least one barrier layer and said second non-continuous layer is formed between said at least one barrier layer and said at least one liner layer.

* * * * *